(12) United States Patent
Yu

(10) Patent No.: US 7,270,557 B1
(45) Date of Patent: Sep. 18, 2007

(54) HIGH-DENSITY STORAGE DEVICE

(75) Inventor: Hong-Chi Yu, K.E.P.Z. Kaohsiung (TW)

(73) Assignee: Walton Advanced Engineering, Inc., K.E.P.Z. Kaohsiung (TW)

( * ) Notice: Subject to any disclaimer, the term of this patent is extended or adjusted under 35 U.S.C. 154(b) by 0 days.

(21) Appl. No.: 11/423,548

(22) Filed: Jun. 12, 2006

(51) Int. Cl.
*H01R 13/28* (2006.01)
*H01R 25/00* (2006.01)

(52) U.S. Cl. ...................... 439/284; 439/289

(58) Field of Classification Search ............... 439/284, 439/285, 287, 289, 291, 295, 708, 721, 723; 710/313
See application file for complete search history.

(56) References Cited

U.S. PATENT DOCUMENTS 6,809,721 B2 * 10/2004 Love ........................... 345/161
2004/0252560 A1 * 12/2004 Hsieh .......................... 365/199
2005/0086413 A1 * 4/2005 Lee et al. .................... 710/313

* cited by examiner

*Primary Examiner*—Hae Moon Hyeon
(74) *Attorney, Agent, or Firm*—patenttm.us; James H. Walters

(57) ABSTRACT

A high-density storage device has a housing and a memory and controller assembly. The housing has a plug part and a socket part receiving the plug part of other high-density storage device. The memory and controller assembly is mounted in the housing and has a circuit board, a source controller integrated circuit and a memory integrated circuit. The circuit board has an upper surface and a bottom surface. The source controller integrated circuit is mounted on the bottom surface. The memory integrated circuit is mounted on the bottom surface of the circuit board. Because the source controller integrated circuit and the memory integrated circuit are mounted on the same side of the circuit board, so high-density storage device has a reduced size. Furthermore, the socket part may connect with another high-density storage devices.

9 Claims, 3 Drawing Sheets

HIGH-DENSITY STORAGE DEVICE

BACKGROUND OF THE INVENTION

1. Field of Invention

The present invention relates to a storage device, and more particularly to a high-density storage device that has a small size and has a plug and a socket to connect with other storage device.

2. Description of the Related Art

A storage device such as a universal serial bus flash drive (USB flash drive) is used as a small, lightweight, removable and rewritable data storage device. The storage device usually has an interface connector such as a USB connector to connect with a computer to output or input data or information.

With reference to FIG. 6, a conventional storage device comprises a size, a shell (30) and a memory and controller assembly (40).

The shell (30) comprises an inner shell (31) and an outer shell (32). The inner shell (31) is made of metal and has an inside end and an outside end (33). The outside end (33) can be plugged into a computer. The outer shell (32) is made of plastic and covers the closed end of the inner shell (31).

The memory and controller assembly (40) mounted in the inner shell (31) and has a circuit board (41), multiple positioning glue (42), a source controller integrated circuit (source controller IC) (43), a memory integrated circuit (memory IC) (44) and an oscillator (45).

The circuit board (41) has an end, an upper surface, a bottom surface, a circuitry and multiple electrical contacts (46). The circuitry is mounted on the upper surface and bottom surface. The electrical contacts (46) are formed on the upper surface at intervals near the end and extend from the end of the flat circuit board (41).

The positioning glues (42) are mounted inside the outside end (33) and respectively mounted between the upper surface of the circuit board (41) and the inner shell (31) and between the bottom surface of the circuit board (41) and the inner surface to connect the outside end (33) of the shell (10), the electrical contacts (46) and the circuit board (41) together.

The source controller IC (43) is mounted on the upper surface of the circuit board (41), is adjacent to the positioning glue (42) mounted between the upper surface of the circuit board (41) and the inner shell (31) and electrically connects with the circuitry of the circuit board (41).

The memory IC (44) is mounted on the bottom surface of the circuit board (41), is adjacent to the positioning glue (42) mounted between the bottom surface of the circuit board (41) and the inner shell (31) and electrically connects with the circuitry of the circuit board (41).

The oscillator (45) is mounted on the upper surface of the circuit board (41), is adjacent to the source controller IC (43) and electrically connects with the circuitry of the circuit board (41).

However, the source controller IC (43) and the memory IC (44) are respectively mounted on the upper surface and the bottom surface of the circuit board (41), so the size of the conventional storage device is enlarged. Furthermore, the conventional storage device only has the outside end (33) and doesn't have a socket to receive and connect with another storage device, so the conventional storage device has a limited usability.

To overcome the shortcomings, the present invention provides a high-density storage device to mitigate or obviate the aforementioned.

SUMMARY OF THE INVENTION

The primary objective of the present invention is to provide a high-density storage device that has a small size and has a plug and a socket to connect with other storage device.

To achieve the objective, a high-density storage device comprises a housing and a memory and controller assembly. The housing has a plug part and a socket part. The memory and controller assembly is mounted in the housing and has a circuit board, a source controller integrated circuit (source controller IC) and a memory integrated circuit (memory IC). The circuit board has an upper surface, a bottom surface, a circuitry mounted on circuit board, multiple first electrical contacts and multiple second electrical contacts. The first electrical contacts extend from the circuitry and are formed on the upper surface at intervals. The second electrical contacts extend from the circuitry and are formed on the upper surface at intervals. The source controller IC is mounted on the bottom surface of the circuit board and electrically connecting with the circuitry of the circuit board. The memory IC is mounted on the bottom surface of the circuit board and electrically connecting with the circuitry of the circuit board.

Other objectives, advantages and novel features of the invention will become more apparent from the following detailed description when taken in conjunction with the accompanying drawings.

DETAILED DESCRIPTION OF THE INVENTION

Figure 1:
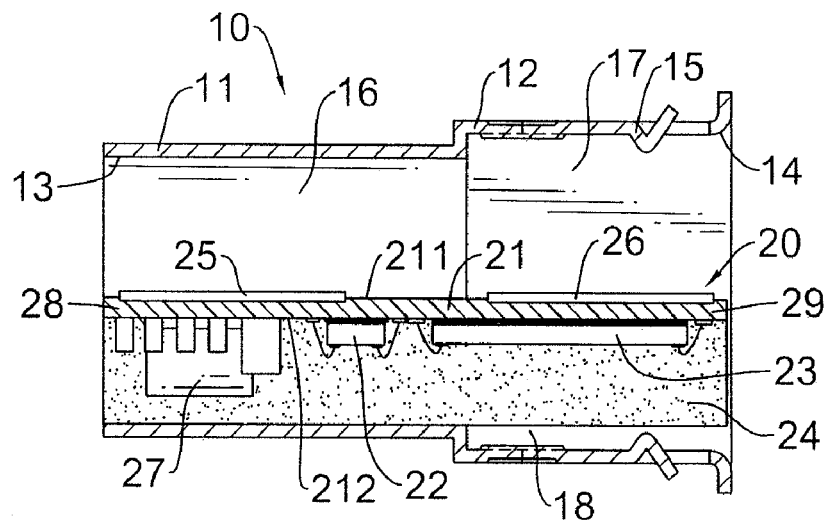
FIG. 1 is a cross sectional side view of high-density storage device in accordance with the present invention.
Figure 2:
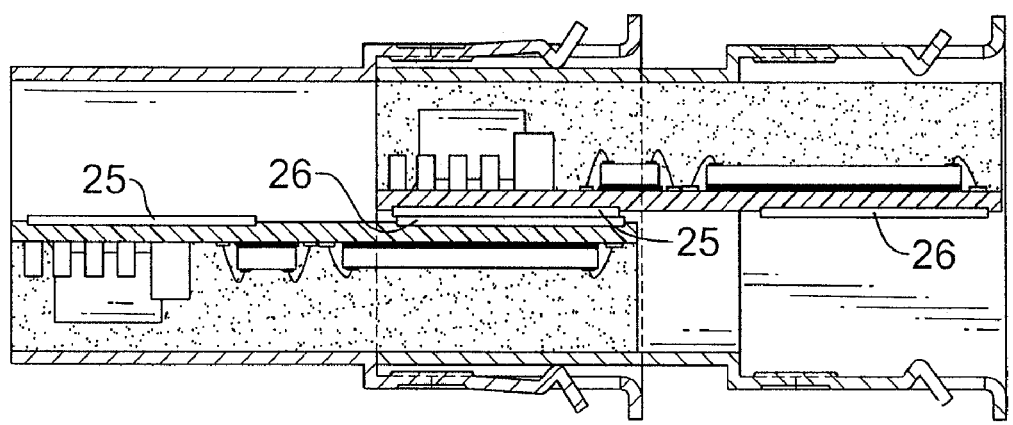
FIG. 2 is a cross sectional side view of two high-density storage devices in FIG. 1 connecting with each.

With reference to FIGS. 1 and 2, a high-density storage device in accordance with the present invention has a size and comprises a housing (10), a memory and controller assembly (20), a plug space (16) and a socket space (17).

The housing (10) comprises a through hole, a plug part (11) and a socket part (12). The plug part (11) is able to plug into a computer or other high-density storage device and has an upper inner surface, a bottom inner surface and a narrowed opening (13). The socket part (12) receives a plug part of another high-density storage device and has an upper inner surface, a bottom inner surface, an enlarged opening (14) and two resilient protrusions (15). The resilient protrusions (15) are respectively mounted on the upper inner surface and the bottom inner surface of the socket part (12). When the plug part (11) of a first high-density storage device is plugged into the socket part (12) of a second high-density storage device, the resilient protrusion (15) of the second high-density storage device holds the plug part (11) of first high-density storage device in place.

The memory and controller assembly (20) is mounted in the housing (10) and has a circuit board (21), a source controller integrated circuit (source controller IC) (22), a memory integrated circuit (memory IC) (23), a positioning glue (24) and multiple passive components.

Figure 3:
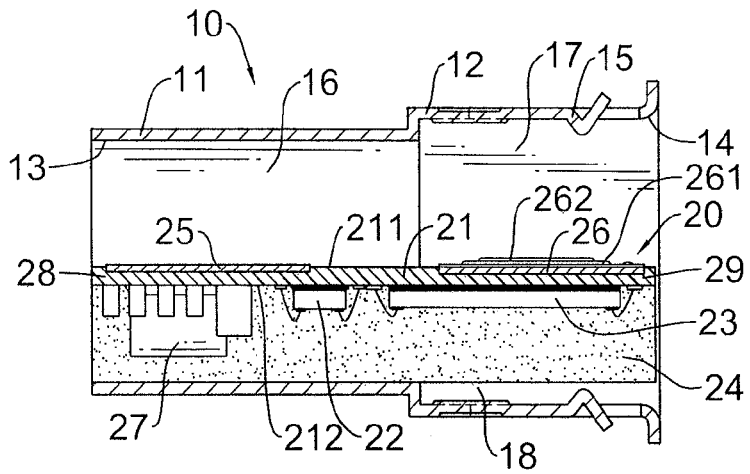
FIG. 3 is a cross sectional side view of the high-density storage device in FIG. 1 with an electrical resilient sheet.
Figure 4:
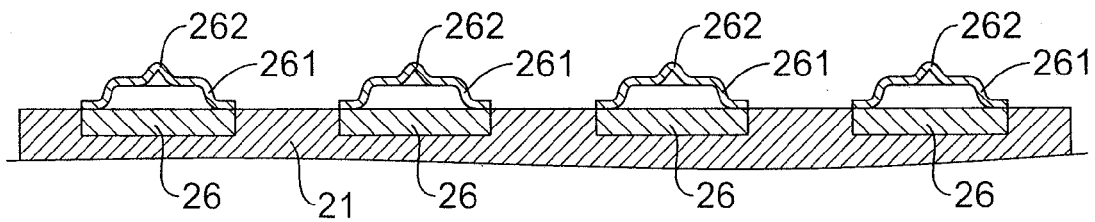
FIG. 4 is an enlarged end view in partial section of with a protrusion part of the electrical resilient of the high-density storage device in FIG. 3.
Figure 5:
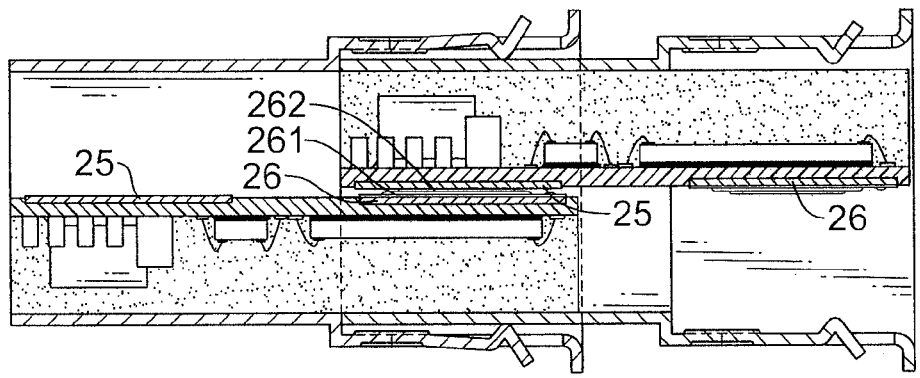
FIG. 5 is a cross sectional side view of two high-density storage devices in FIG. 3 connecting with each other.
Figure 6:
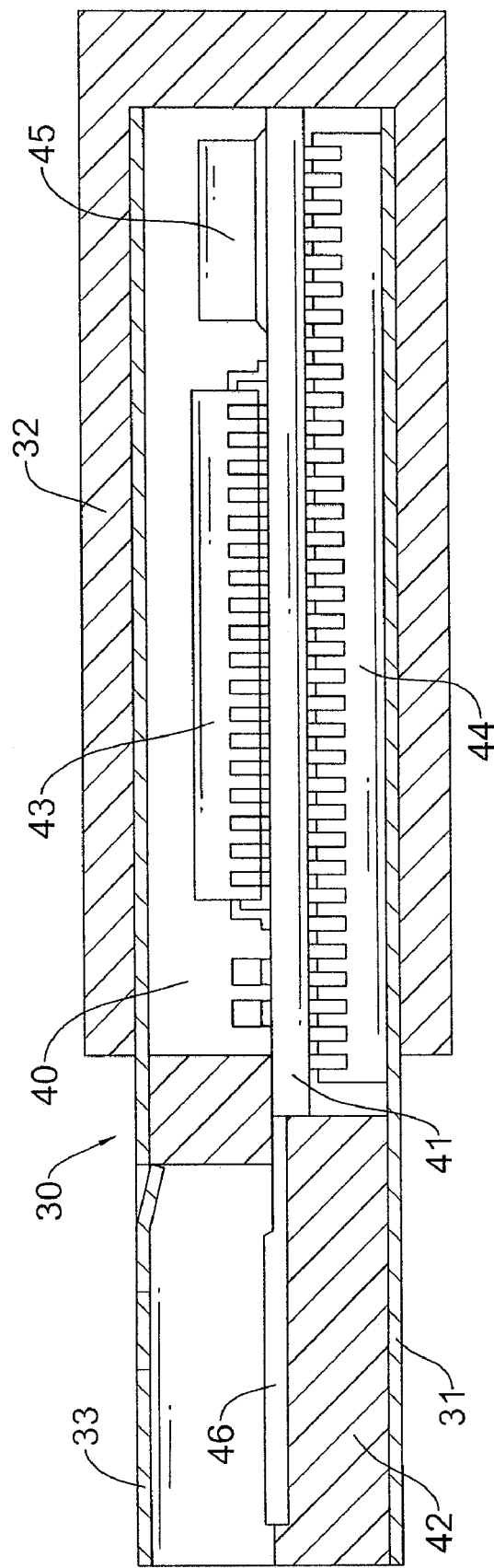
FIG. 6 is a side view in partial section of a conventional high-density storage device in accordance with the prior art.

With further reference to FIGS. 3 to 5, the circuit board (21) is mounted in the through hole and has an upper surface (211), a bottom surface (212), a first section (28), a second section (29), a circuitry, multiple first electrical contacts (25) and multiple second electrical contacts (26). The first section (28) corresponds to and is mounted in the plug part (11) of the housing (10). The second section (29) corresponds to and is mounted in the socket part (12) of the housing (10). The circuitry is mounted on circuit board (21). The first electrical contacts (25) extend from the circuitry, are formed on the upper surface (211) at intervals and are mounted in the first section (28) of the circuit board (21). The second electrical contacts (26) extend from the circuitry, are formed on the upper surface (211) at intervals and are mounted in the second section (29) of the circuit board (21). The second electrical contacts (26) of the first high-density storage device respectively contact the first electrical contacts (25) of the second high-density storage device when the second high-density storage device receives the first high-density storage device. Each second electrical contact (26) may further have an electrical resilient sheet (261) mounted on the second electrical contact (26). The electrical resilient sheet (261) has two sides and a protruding part (262). At least one side of the electrical resilient sheet (261) connects with a corresponding second electrical contact (26). The protruding part (262) is an inverse V-shaped and is formed in a middle of the electrical resilient sheet (261). When the second high-density storage device receives the first high-density storage device, the protruding part (262) of the electrical resilient sheet (261) and the resilient protrusion (15) of the second high-density storage device tightly press against and securely hold the plug part of the first high-density storage device.

The source controller IC (22) is mounted on the bottom surface (212) of the circuit board (21) and electrically connects with the circuitry of the circuit board (21) by Flip-Chip bonding (FC), wire-bonding, surface mounting technology or the like.

The memory IC (23) is mounted on the bottom surface (212) of the circuit board (21), and electrically connects with the circuitry of the circuit board (21) by Flip-Chip bonding (FC), wire-bonding, surface mounting technology or the like. The memory IC (23) and the source controller IC (22) may be integrated into an integrated circuit (IC) to electrically connect with a circuit board (21).

The positioning glue (24) is mounted on the bottom surface (212) and between the bottom surface (212) and the bottom inner surface of the plug part (11) and the socket part (12) to cover and fasten the source controller IC (22) and the memory IC (23). The positioning glue (24) has a bottom surface and a height between the bottom surface of the positioning glue (24) and the bottom surface (212) of the circuit board (21). The height between the bottom surface of the positioning glue (24) and the bottom surface (212) of the circuit board (21) is equal to a height between the bottom inner surface of the plug part (11) and the bottom surface (212) of the circuit board (21), so there is an interval (18) formed between the bottom inner surface of the socket part (12) and the bottom surface of the positioning glue (24).

The light emitting diode (LED) is mounted on the upper surface (211) of the circuit board (21), is mounted between the first electrical contacts (25) and the second electrically contacts (26) and electrical connects with the circuitry of the circuit board (21) to emit light when the high-density storage device is connecting with a computer.

The passive components are mounted on the bottom surface (212) of the circuit board (21), electrically connect with the circuitry of the circuit board (21), are covered by the positioning glue (24) and comprises an oscillator (27), a capacitance, a resistor or the like.

The plug space (16) is formed in the plug part (11) of the housing (10) and between the upper inner surface of the plug part (11) and the first electrical contacts (25). The socket space (17) is formed in the socket part (12) of the housing (10) and between the upper inner surface of the socket part (12) and the second electrical contacts (26).

When more than two high-density storage devices connect with each other, turn the first high-density storage devices upside down and then plug the first high-density storage devices into the second high-density storage device. This time, the plug part (11) of the first high-density storage device is mounted in the socket part (12) of the second high-density storage device. The positioning glue (24) and the first electrical contacts (25) in the plug part (11) of the first high-density storage device is mounted in the socket space (17) of the second high-density storage device. The positioning glue (24) and the second electrical contacts (26) in the socket part (12) of the second high-density storage device is mounted in the plug space (16) of the first high-density storage device. The first electrical contacts (25) of the first high-density storage device contacts to the second electrical contacts (26) of the second high-density storage device, so data or information can be transferred from one high-density storage device to the others.

The high-density storage device with the plug part (11) and socket part (12) may connect with another high-density storage devices. Furthermore, the source controller IC (22), the memory IC (23) and passive components are mounted compactly on the bottom surface (212) of the circuit board (21), so the size of the high-density storage device is decreased.

Even though numerous characteristics and advantages of the present invention have been set forth in the foregoing description, together with details of the structure and function of the invention, the disclosure is illustrative only. Changes may be made in detail, especially in matters of shape, size and arrangement of parts within the principles of the invention to the full extent indicated by the broad general meaning of the terms in which the appended claims are expressed.

What is claimed is:

1. A storage device comprising:
   a housing having
      a through hole;
      a plug part having
         an upper inner surface;
         a bottom inner surface; and
      a socket part adapted for receiving a plug part of another storage device and having
         an upper inner surface; and
         a bottom inner surface;
   a memory and controller assembly mounted in the housing and having
      a circuit board mounted in the through hole and having
         an upper surface;
         a bottom surface;
         a first section mounted in the plug part of the housing;

a second section corresponding to and mounted in the socket part of the housing;

a circuitry mounted on circuit board;

multiple first electrical contacts extending from the circuitry, formed on the upper surface at intervals and mounted in the first section of the circuit board; and multiple second electrical contacts extending from the circuitry, formed on the upper surface at intervals and mounted in the second section of the circuit board;

a source controller integrated circuit (source controller IC) mounted on the bottom surface of the circuit board and electrically connecting with the circuitry of the circuit board;

a memory integrated circuit (memory IC) mounted on the bottom surface of the circuit board and electrically connecting with the circuitry of the circuit board.

2. The storage device as claimed in claim 1 further has a plug space formed in the plug part of the housing and between the upper inner surface of the plug part and the first electrical contacts; and a socket space formed in the socket part of the housing and between the upper inner surface of the socket part and the second electrical contacts.

3. The storage device as claimed in claim 1 further has a positioning glue mounted on the bottom surface of the circuit board and between the bottom surface of the circuit board and the bottom inner surface of the plug part and the socket part to cover and hold the source controller IC and the memory IC.

4. The storage device as claimed in claim 3 further has multiple passive components mounted on the bottom surface of the circuit board, electrically connecting with the circuitry of the circuit board, covered by the positioning glue.

5. The storage device as claimed in claim 1, wherein the socket part further has two resilient protrusions respectively mounted on the upper inner surface and the bottom inner surface of the socket part.

6. The storage device as claimed in claim 1, wherein each second electrical contact has an electrical resilient sheet.

7. The storage device as claimed in claim 3, wherein the positioning glue has a bottom surface; and a height between the bottom surface of the positioning glue and the bottom surface of the circuit board being equal to a height between the bottom inner surface of the plug part and the bottom surface of the circuit board.

8. The storage device as claimed in claim 6, wherein each electrical resilient sheet has two sides and at least one of the side connecting with a corresponding one of the second electrical contacts.

9. The storage device as claimed in claim 8, wherein each electrical resilient sheet further has a protruding part being an inverse V-shaped.

* * * * *